(12) United States Patent
Tripodi et al.

(10) Patent No.: US 11,606,083 B2
(45) Date of Patent: *Mar. 14, 2023

(54) PWM SIGNAL GENERATOR CIRCUIT AND RELATED INTEGRATED CIRCUIT

(71) Applicant: STMicroelectronics S.r.l., Agrate Brianza (IT)

(72) Inventors: Domenico Tripodi, Milan (IT); Luca Giussani, Canegrate (IT); Simone Ludwig Dalla Stella, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/515,069

(22) Filed: Oct. 29, 2021

(65) Prior Publication Data

US 2022/0052672 A1    Feb. 17, 2022

Related U.S. Application Data

(63) Continuation of application No. 17/077,833, filed on Oct. 22, 2020, now Pat. No. 11,171,632.

(30) Foreign Application Priority Data

Oct. 29, 2019   (IT) .................. 102019000019910

(51) Int. Cl.
*H03K 3/017* (2006.01)
*H03K 5/04* (2006.01)
*H03K 5/05* (2006.01)
*H03L 7/08* (2006.01)

(52) U.S. Cl.
CPC ............ *H03K 3/017* (2013.01); *H03K 5/04* (2013.01); *H03K 5/05* (2013.01); *H03L 7/08* (2013.01)

(58) Field of Classification Search
CPC ........ H03K 3/017; H03K 5/04; H03K 5/1565; H03K 5/05; H03K 5/156; H03L 7/08
See application file for complete search history.

(56) References Cited

U.S. PATENT DOCUMENTS

| | | | |
|---|---|---|---|
| 6,819,190 B2 | 11/2004 | Pearce et al. | |
| 7,206,343 B2 | 4/2007 | Pearce | |
| 7,791,387 B1 | 9/2010 | Wong | |
| 11,171,632 B2 * | 11/2021 | Tripodi | ................... H03K 5/04 |

(Continued)

*Primary Examiner* — Jung Kim
(74) *Attorney, Agent, or Firm* — Seed Intellectual Property Law Group LLP

(57) ABSTRACT

A PWM signal generator circuit includes a multiphase clock generator that generates a number n of phase-shifted clock phases having the same clock period and being phase shifted by a time corresponding to a fraction 1/n of the clock period. The PWM signal generator circuit determines for each switch-on duration first and second integer numbers, and for each switch-off duration third and fourth integer numbers. The first integer number is indicative of the integer number of clock periods of the switch-on duration and the second integer number is indicative of the integer number of the additional fractions 1/n of the clock period of the switch-on duration. The third integer number is indicative of the integer number of clock periods of the switch-off duration, and the fourth integer number is indicative of the integer number of the additional fractions 1/n of the clock period of the switch-off duration.

20 Claims, 10 Drawing Sheets

(56) References Cited

U.S. PATENT DOCUMENTS

| | | |
|---|---|---|
| 2010/0127789 A1 | 5/2010 | Kenly et al. |
| 2012/0154005 A1 | 6/2012 | Frederiksen et al. |
| 2013/0271196 A1 | 10/2013 | Cao et al. |
| 2015/0171843 A1 | 6/2015 | Kim |
| 2018/0017944 A1 | 1/2018 | Lee et al. |
| 2019/0245528 A1 | 8/2019 | Reitsma |
| 2021/0112641 A1* | 4/2021 | Li ........................ H05B 45/325 |

* cited by examiner

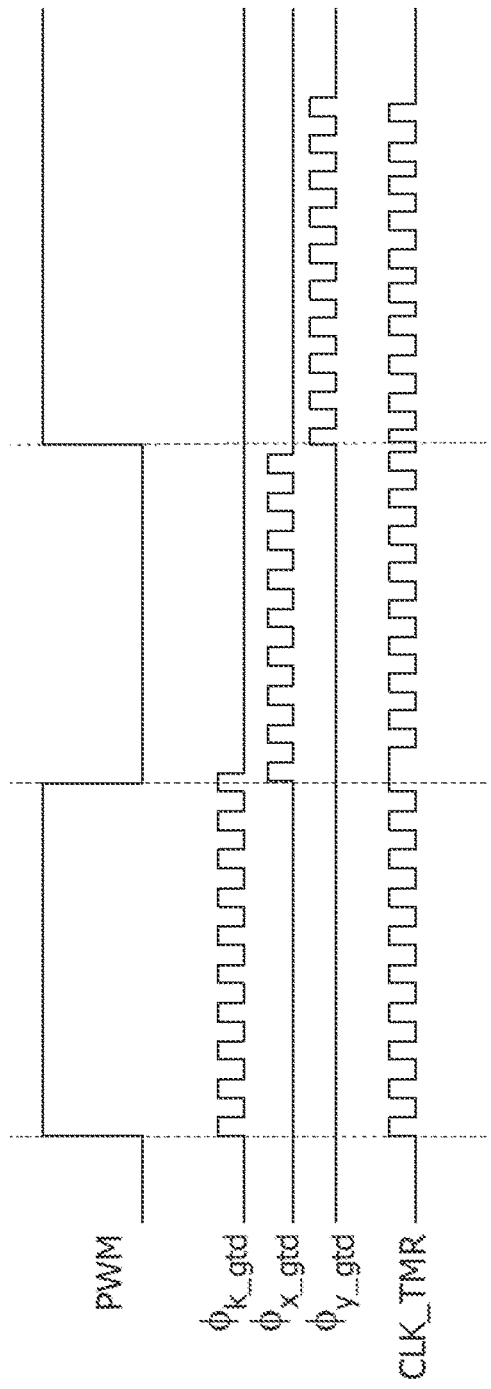
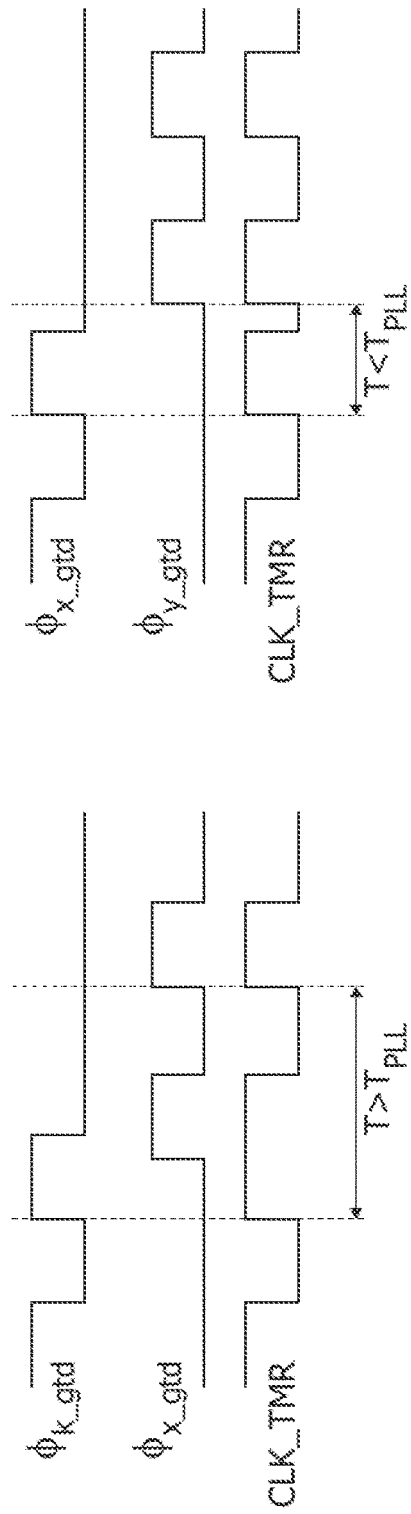
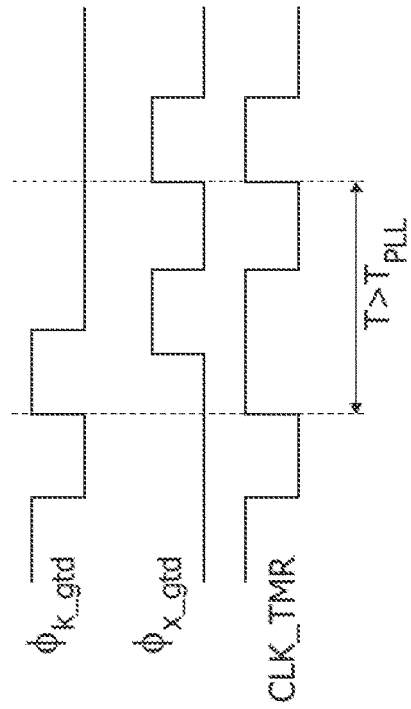

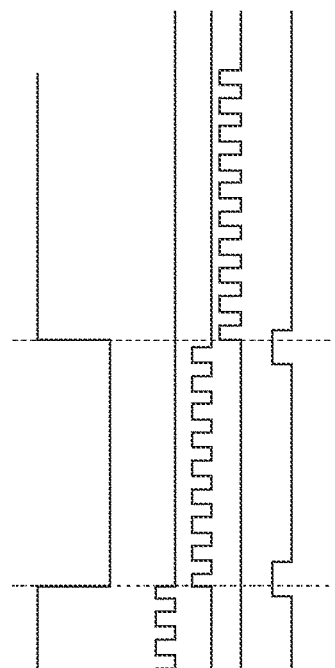
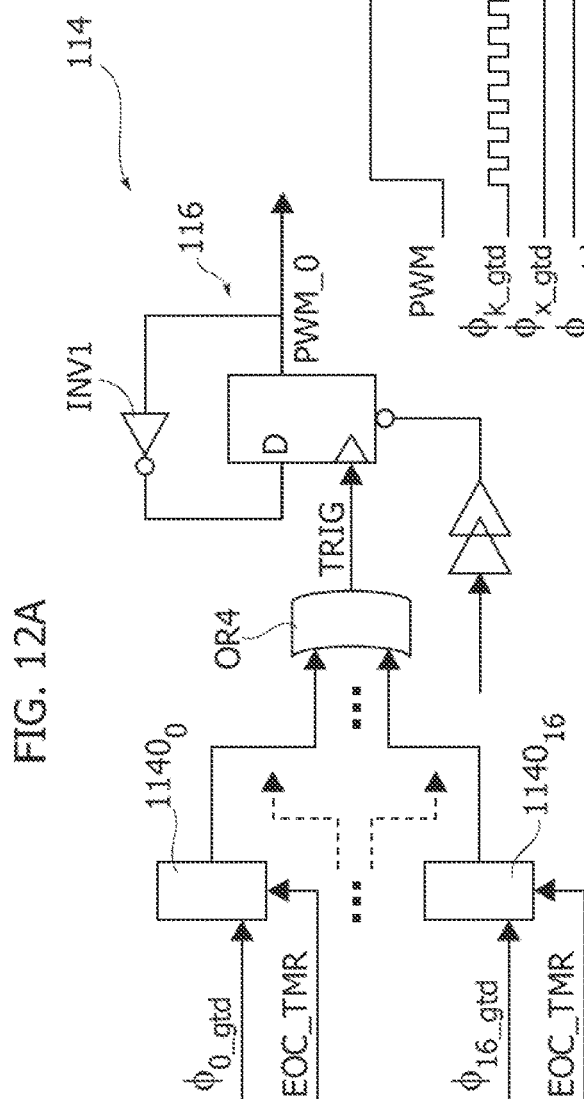
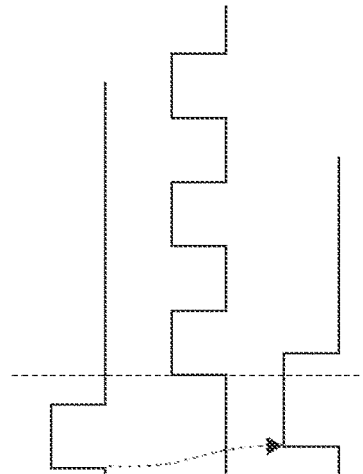
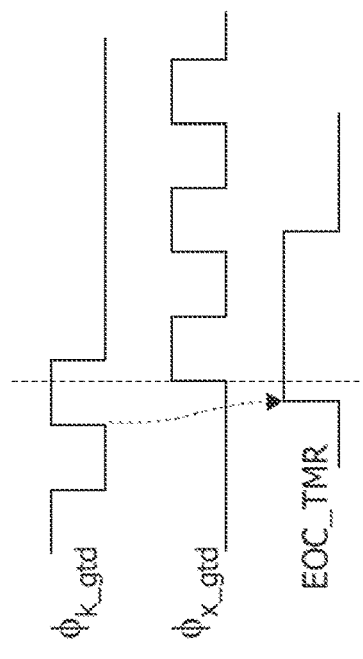

PWM SIGNAL GENERATOR CIRCUIT AND RELATED INTEGRATED CIRCUIT

BACKGROUND

Technical Field

The embodiments of the present description refer to solutions for generating a pulse-width modulation (PWM) signal.

Description of the Related Art

Generally, as shown in FIG. 1, a PWM signal is a periodic signal having a given switching period $T_{SW}$, wherein the PWM signal is set to high for a given switch-on duration $T_{ON}$ and low for a given switch-off duration $T_{OFF}$, with:

$$T_{SW} = T_{ON} + T_{OFF} \qquad (1)$$

Moreover, often is defined the duty cycle D of the PWM signal, with $D = T_{ON}/T_{SW}$.

Such a PWM signal may be generated in various modes. For example, as shown in FIG. 1, one of the simplest solutions is based on an oscillator circuit generating a clock signal CLK and a counter configured to increase a count value in response to the clock signal CLK. Thus, by using a comparator circuit the PWM signal may be generated as a function of the count value provided by the counter, e.g., by comparing the count value with given threshold values, e.g., indicative of the switch-on duration $T_{ON}$ and the switching period $T_{SW}$.

However, in such a (digital) implementation, the accuracy and resolution of the PWM signal is limited by the clock period $T_{CLK}$ (sampling frequency) of the clock signal CLK. Moreover, by increasing the clock frequency $f_{CLK} = 1/T_{CLK}$ also the switching losses will increase.

In many applications, high resolution PWM signals are required or strongly preferred. For example, this PWM signals may be used in many applications to control the average value of a voltage or current, such as for wireless battery chargers, switching mode power converters, motor control and lighting. For example, in such applications a half-bridge or full bridge may be used to drive a resonant tank, usually comprising one or more inductors and capacitors, wherein the electronic switches of the half-bridge or full bridge are driven by means of PWM signals.

In order to miniaturize the equipment, small inductors may be used leading to a high working frequency. Thus, often a high-frequency modulated waveform PWM signal with high precise resolution should be provided in order to keep power consumption at acceptable values. For example, in a switching power supply, the output voltage is often directly proportional to the PWM duty cycle. The smaller is the adjustment to the duty cycle, the smaller is the resulting change to the output, i.e., a more precise control of the output voltage that permits to achieve a better accuracy level and system stability. Moreover, minimizing output voltage ripple means reduce noise levels.

An alternative solution for generating a PWM signal, in particular a High Resolution (HR) PWM signal, is based on the use of multiple clock phases, i.e., phase-shifted clock signals having the same frequency.

For example, FIG. 2 shows a possible circuit for generating multiple clock phases $\phi_0 \ldots \phi_n$, via a Delay Locked Loop (DLL).

Specifically, in the example considered the clock signal CLK generated by an oscillator OSC is fed to a cascade of a plurality of (identical) delay stages $DU_1 \ldots DU_n$. Specifically, in the example considered, the first phase $\phi_0$ corresponds to the clock signal CLK, and the other phases $\phi_1 \ldots \phi_n$, correspond to the output signals of the delay stages $DU_1 \ldots DU_n$.

In the example considered, each of the delay stages $DU_1 \ldots DU_n$ has a delay $T_{DU}$ being programmable/settable as a function of a (voltage or current) control signal CTRL. For example, such delay stages DU having a variable delay may be implemented with an even number of inverters, wherein one or more of the inverters charges a respective capacitance, such as a parasitic capacitance, connected to the output of the inverter. In this case, the control signal CTRL may be indicative of the current provided by the inverter to charge the respective capacitance, thereby varying the time until the following inverter switches.

In the example considered, the last phase $\phi_n$ (having a given delay $T_D = n \cdot T_{DU}$ with respect to the clock signal CLK) and the clock signal CLK is provided to a phase detector PD. The output of the phase detector PD is fed to a regulator CP having at least an I (Integral) component, such as a charge pump, wherein the regulator CP provides at output the control signal CTRL. Optionally the control signal CTRL may be passed through a loop filter LF.

Thus, essentially, the negative feedback loop, implemented by the blocks PD/CP/LF, synchronizes in time the last phase $\phi_n$ with the clock signal CLK. If the delay cells DU are identical, all the clock phases $\phi_1 \ldots \phi_n$ will have the same frequency $f_{CLK}$, but are phase shifted with respect to the preceding phase by a delay of $T_{DU} = T_{CLK}/n$.

Such multiple clock phases may also be provided by a Phase Locked Loop (PLL) comprising a Voltage Controlled Oscillator (VCO) comprising a ring-oscillator with a plurality of delay stages, wherein the PLL is locked to the frequency of a clock signal CLK. Also in this case, a locking of the PLL may be obtained by varying the delay introduced by the delay stages, e.g., by varying via a bias circuit the current provided by the inverter stages implementing such delay stages, until the oscillator signal at the output of the VCO corresponds to the clock signal CLK. Thus, each delay stage of the VCO may provide a respective clock phase, which is phase shifted by a given fraction of the period of the clock signal CLK.

For example, FIG. 3 shows exemplary waveforms for the phases $\phi_1 \ldots \phi_{16}$ in case n=17, wherein the last phase $\phi_{17} = \phi_0 = $ CLK is not shown in the Figure.

Accordingly, as shown in FIG. 4, while a counter and respective comparator circuit may provide a coarse PWM signal (having a plurality k of clock cycles of the clock signal CLK), the additional clock phases $\phi_1 \ldots \phi_n$ may be used to add a fine tuning to the coarse PWM signal, which essentially permits to add fractions $T_{DU}$ of the clock signal CLK to the coarse PWM signal. For example, such a solution is described in document U.S. Pat. No. 7,206,343 B2, the content thereof being incorporated herein by reference for this purpose.

For example, the fraction may be added to the coarse PWM signal by:
- directly combining, e.g., by using one or more logic (e.g., OR) gates, the coarse PWM signal with a given selected clock phase $\phi$, or
- as described in document U.S. Pat. No. 7,206,343 B2, indirectly by passing the coarse PWM signal through additional delay stages and combining the coarse PWM signal with the delayed PWM signal, e.g., via a logic (e.g., OR) gate, wherein the additional delay stages introduce the same delay $T_{hu}$ as the delay stages DU$_1$ . . . DU$_n$, e.g., by biasing the additional delay stages with the same control signal CTRL as the delay stages DU$_1$ . . . DU$_n$.

Thus, assuming that the counter (and a respective comparator circuit) provides a coarse PWM signal having a switching period $T_{SW}=i \cdot T_{CLK}$ and a switch-on duration of $T_{ON}=k \cdot T_{CLK}$, with $0 \leq k \leq i$, the final PWM signal may have a switching period $T_{SW}=i \cdot T_{CLK}$ and a switch-on duration $T_{ON}=k \cdot T_{CLK}+l \cdot T_{CLK}/n$, with $0 \leq l < n$. Thus, the switch-on duration $T_{ON}$ of the PWM signal may be selected by setting the integer values of the parameters k and l. Thus, essentially the use of an additional DLL or PLL permits to vary the switch-on duration $T_{ON}$, or in general the duty cycle D, with a higher precision, while the switching period $T_{SW}$ remains constant.

BRIEF SUMMARY

Considering the foregoing, various embodiments of the present disclosure provide solutions for generating a PWM signal.

According to one or more embodiments, a PWM signal generator circuit is provided having the distinctive elements set forth in the following description. The embodiments also concern a corresponding integrated circuit.

Various embodiments of the present disclosure relate to a PWM signal generator circuit configured to generate a Pulse-Width Modulated signal having a given switching duration comprising a switch-on duration and a switch-off duration.

In various embodiments, the PWM signal generator circuit comprises a multiphase clock generator configured to generate a given number n of phase-shifted clock phases having the same clock period and being phase shifted by a time corresponding to a fraction 1/n of the clock period.

In various embodiments, the PWM signal generator circuit is configured to:
  determine for each switch-on duration a first and a second integer number, the first integer number being indicative of the integer number of clock periods of the switch-on duration and the second integer number being indicative of the integer number of the fractions 1/n of the clock period of the switch-on duration in addition to the integer number of clock periods of the switch-on duration, and
  determine for each switch-off duration a third and a fourth integer number, the third integer number being indicative of the integer number of clock periods of the switch-off duration or the integer number of clock periods of the switching duration, and the fourth integer number being indicative of the integer number of the fractions 1/n of the clock period of the switch-off duration in addition to the integer number of clock periods of the switch-off duration.

For example, in various embodiments, the PWM signal generator circuit may receive at input the first, second third, and fourth integer number.

In various embodiments, the PWM signal generator circuit comprises a clock switching circuit, a timer circuit, a phase accumulator circuit and a toggle circuit.

In various embodiments, the clock switching circuit is configured to generate a timer clock signal by selecting one of the phase-shifted clock phases as the timer clock signal as a function of a selection signal.

For example, in various embodiments, the clock switching circuit comprises:
  for each of the phase shifted clock phases a respective transmission gate, and wherein each transmission gate is configured to generate a respective gated clock phase as a function of the selection signal; and
  a combinational logic circuit configured to generate the timer clock signal by combining the gated clock phases.

In various embodiments, the timer circuit comprises one or more counters and one or more comparators, wherein the timer circuit is configured to:
  during a switch-on duration, vary a first count value in response to the timer clock signal and generate a first trigger when the first count value reaches the first integer number, and
  during a switch-off duration, vary a second count value in response to the timer clock signal and generate a second trigger when the second count value reaches the second integer number.

For example, the timer circuit may comprise a single counter configured to generate the first count value and the second count value. In this case, the third integer number may be indicative of the integer number of clock periods of the switch-off duration, and the single counter may be reset at the beginning of each switch-on duration and each switch-off duration. Alternatively, the third integer number may be indicative of the integer number of clock periods of the switching duration, and the single counter may be reset only at the beginning of each switch-on duration.

In various embodiments, the phase accumulator circuit is configured to generate the selection signal by:
  during a switch-on duration, increasing the selection signal by the second integer number, and
  during a switch-off duration, increasing the selection signal by the fourth integer number.

Generally, the variation of the selection signal may occur at any instant during the respective switch-on or switch-off period. However, preferably, the phase accumulator circuit is configured to generate the selection signal by:
  in response to the first trigger, increasing the selection signal by the second integer number, and
  in response to the second trigger, increasing the selection signal by the fourth integer number.

In various embodiments, the toggle circuit is configured to:
  in response to the first trigger, setting the PWM signal to low, and
  in response to the second trigger, setting the PWM signal to high.

In such embodiments, the timer circuit operates thus with an adaptive clock signal resulting from a switching/combination of the phase-shifted clock phases.

The inventors have observed that the switching of the clock phases may thus occur while the previous clock phase is high, resulting in a loss of an edge used to increase the timer circuit.

Accordingly, in order to compensate this missing edge, in various embodiments, the PWM signal generator circuit is configured to:
  during a switch-on duration, determine whether the second integer number is smaller than n/2, and in case the second integer number is smaller than n/2, increase the first count value for a single clock cycle of the timer clock signal by two; and
  during a switch-off duration, determine whether the fourth integer number is smaller than n/2, and in case the fourth integer number is smaller than n/2, increase the second count value for a single clock cycle of the timer clock signal by two.

Alternatively, the PWM signal generator circuit may be configured to:

during a switch-on duration, determine whether the second integer number is smaller than n/2, and in case the second integer number is smaller than n/2, decrease the first integer number by one; and during a switch-off duration, determine whether the fourth integer number is smaller than n/2, and in case the fourth integer number is smaller than n/2, decrease the third integer number by one.

BRIEF DESCRIPTION OF THE SEVERAL VIEWS OF THE DRAWINGS

The embodiments of the present disclosure will now be described with reference to the drawings, which are provided purely to way of non-limiting example and in which:

FIGS. 9A, 9B, 10A, 10B, 10C, 11A, 11B, 12A, 12B, 12C and 12D show various details of the circuits of FIGS. 6A, 6B and 8.

DETAILED DESCRIPTION

In the ensuing description, various specific details are illustrated to enable an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 5 to 12 described below, parts, elements or components that have already been described with reference to FIGS. 1 to 4 are designated by the same references used previously in these figures. The description of these elements has already been made and will not be repeated in what follows in order not to burden the present detailed description.

As explained in the foregoing, various embodiments of the present description relate to a PWM signal generator circuit configured to generate a high resolution PWM signal. In particular, in various embodiments, the PWM signal generator circuit is configured to receive a plurality of clock phases $\phi_0 \ldots \phi_n$ and generate both the rising and the falling edges of the PWM signal as a function of these clock phases $\phi_0 \ldots \phi_n$, thereby controlling both the PWM duty cycle and the PWM frequency with a higher resolution.

Figure 1:
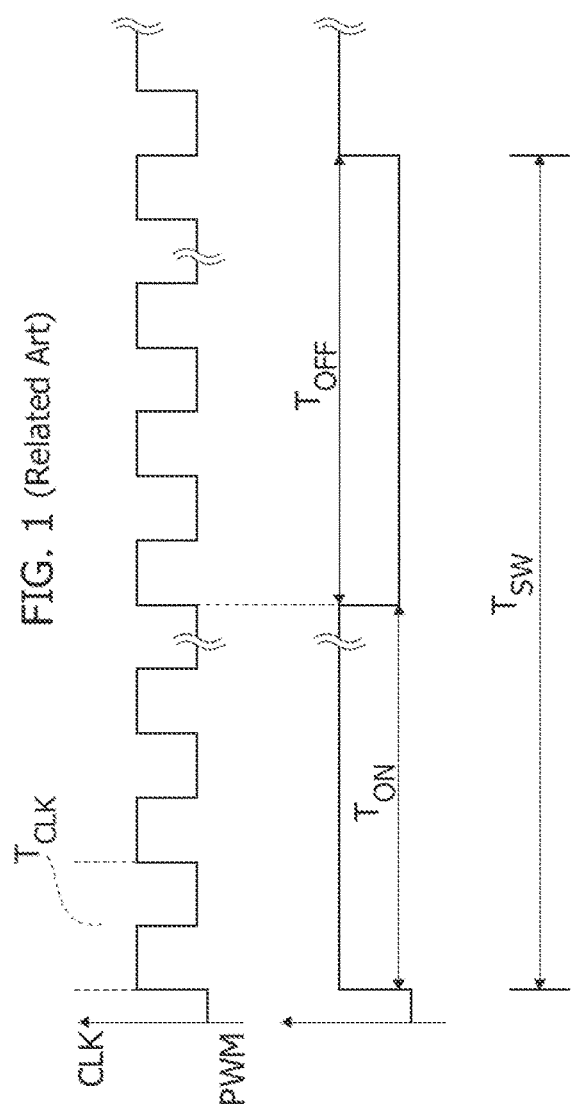
FIG. 1 shows an example of a PWM signal.
Figure 2:
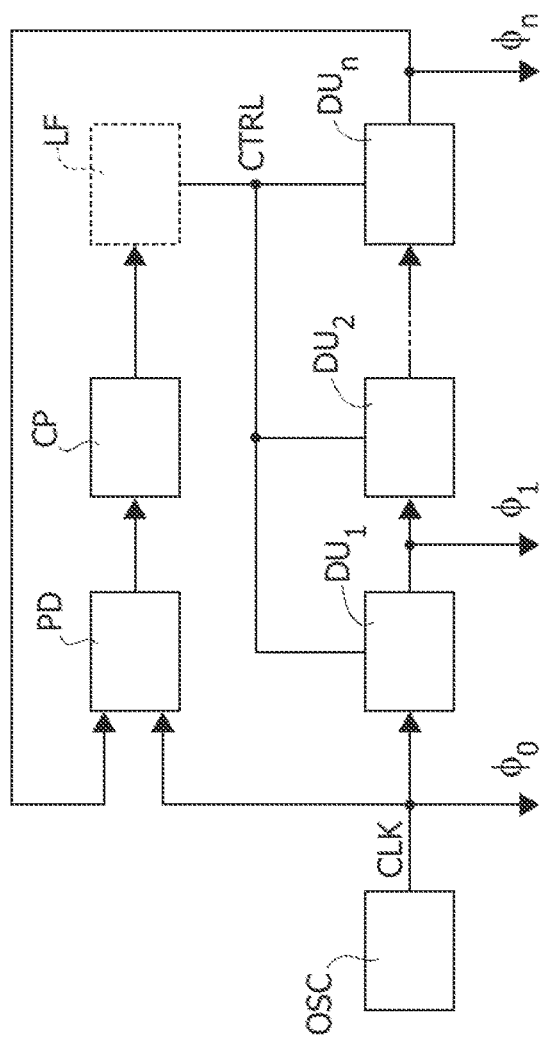
FIG. 2 shows an example of a circuit generating multi-phase clock signals.
Figure 3:
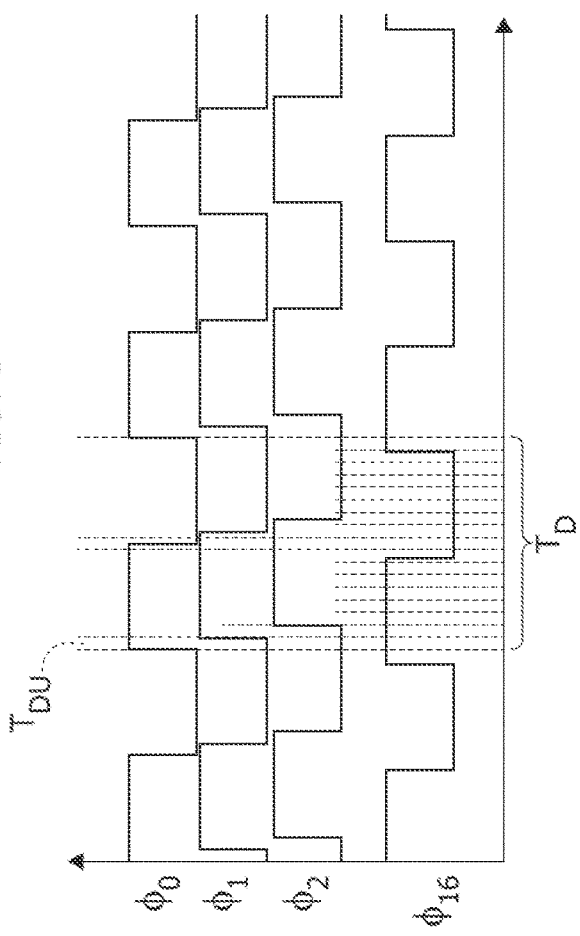
FIG. 3 shows an example of the waveforms of clock phases provided by the circuit of FIG. 2.
Figure 4:
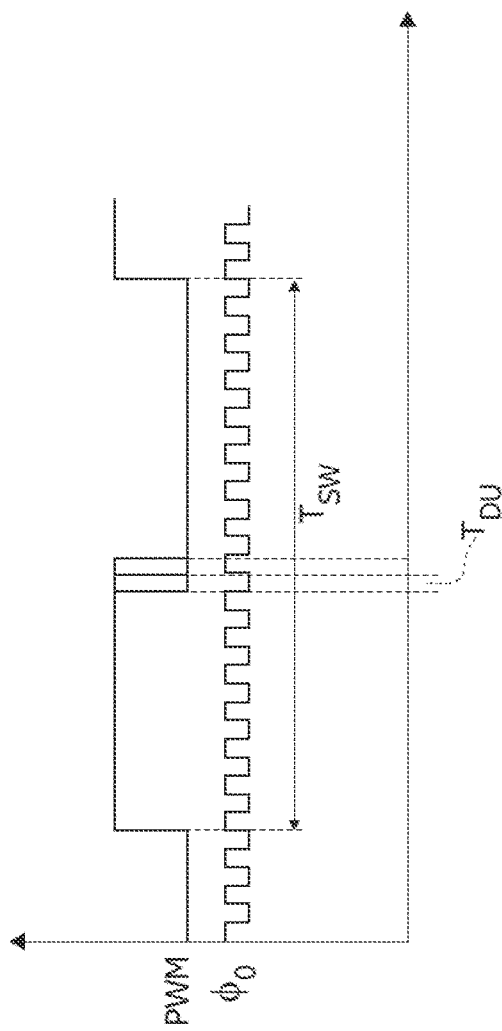
FIG. 4 shows an example of the fine tuning of the switch-on duration of a PWM signal by means of multi-phase clock signals.
Figure 5:
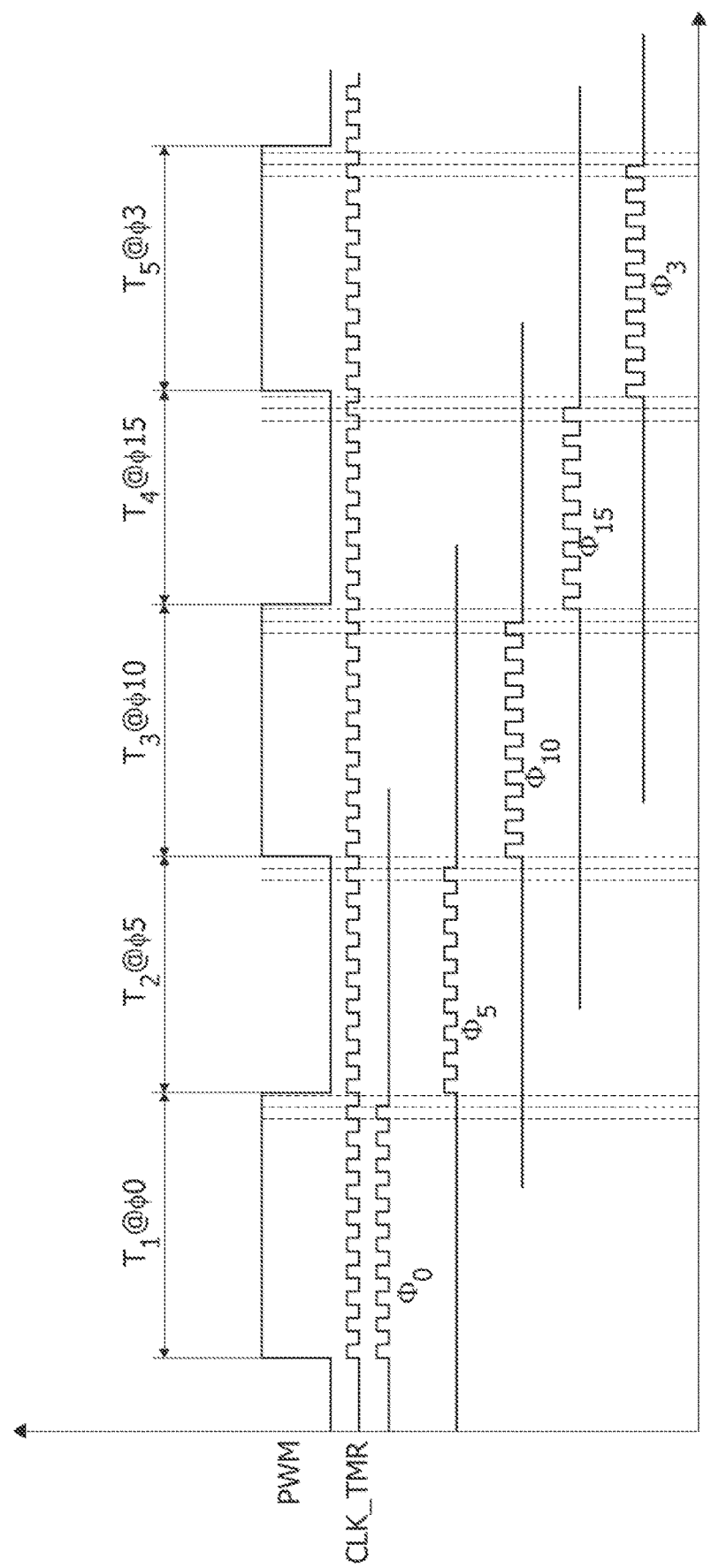
FIG. 5 shows an embodiment of the fine tuning of both the switch-on duration and the switch-off duration of a PWM signal by means of multi-phase clock signals.

FIG. 5 shows the general operation of a first embodiment.

In the embodiment considered, the PWM signal generator circuit receives the first clock phases $\phi_0$ (and/or the last clock phase $\phi_n=\phi_0$) and the intermediate clock phases $\phi_1 \ldots \phi_{n-1}$. In some embodiments, the PWM signal generator circuit includes a multiphase clock generator that generates the various clock phases, which may include any multiphase clock generator configured to generate the clock phases described herein. Possible solutions for generating such clock phases are already described in the introduction of the present disclosure, and the relevant description applies in its entirety (see in particular the description of FIG. 2). That is, in some embodiments, the multiphase clock generator circuit of various embodiments of the present disclosure may be as described, for example, with respect to FIG. 2.

Moreover, in the embodiment considered, the PWM signal generator circuit is configured to generate a PWM signal, wherein:

the switching duration $T_{SW}$ may be set to $T_{SW}=i \cdot T_{CLK}+ j \cdot T_{CLK}/n$; and the switch-on time $T_{ON}$ may be set to $T_{ON}=k \cdot T_{CLK}+ l \cdot T_{CLK}/n$.

In various embodiments, the parameters i, j, k and l integer values, wherein the parameters i, j, k and l may be programmable.

Specifically, in the example shown in FIG. 5, it is assumed that n=17, e.g., the PWM signal generator circuit receives the clock phases $\phi_0 \ldots \phi_{16}$, and the PWM signal generator circuit is configured to generate a PWM signal with:

$$T_{SW}=i \cdot T_{CLK}+10 \cdot T_{CLK}/17=T_i+10 \cdot T_{CLK}/17,$$

a duty cycle of 50% (i.e., $T_{ON}=T_{OFF}=T_{SW}/2$), i.e., $$T_{ON}=T_{OFF}=T_i/2+5 \cdot T_{CLK}/17.$$

In the example considered, it will be assumed for simplicity that i is an even number, and k=p=i/2.

Specifically, in the embodiment considered, the PWM signal generator circuit is configured to use during the first switch-on period $T_1$ the phase $\phi_0$ as clock signal for the digital counter counting the time period $T_i/2=k \cdot T_{CLK}$, and (as will be described in greater detail in the following) the PWM signal generator circuit adds at the end a fraction of $5/17$ of the period $T_{CLK}$ by using the phase $\phi_5$.

However, instead of then tracking the accumulation of the various fractions, the PWM signal generator circuit uses then during the following switch-off period $T_2$ the phase $\phi_5$ (i.e., the phase used to add the fraction) as clock signal for the timer circuit (i.e., the digital counter counting the time period $p \cdot T_{CLK}$). Moreover, the PWM signal generator circuit adds at the end again the respective fraction of $5/17$ of the period $T_{CLK}$ by using in this case the phase $\phi_{10}$, insofar as the phase $\phi_{10}$ is shifted by a delay of $5 \cdot T_{CLK}/17$ with respect to the phase $\phi_5$.

Next, the PWM signal generator circuit use during the second switch-on period $T_3$ the phase $\phi_{10}$ as clock signal for the digital counter counting the time period $k \cdot T_{CLK}$, and the PWM signal generator circuit adds at the end a fraction of 5/17 of the period $T_{CLK}$ by using this time the phase $\phi_{15}$, insofar as the phase $\phi_{15}$ is shifted by a delay of $5 \cdot T_{CLK}/17$ with respect to the phase $\phi_{10}$.

Similarly, the PWM signal generator circuit use during the following switch-off period $T_4$ the phase $\phi_{15}$ as clock signal for the digital counter counting the time period $p \cdot T_{CLK}$, and the PWM signal generator circuit adds at the end a fraction of 5/17 of the period $T_{CLK}$ by using this time the phase $\phi_3$, insofar as the phase $\phi_3$ is shifted by a delay of $5 \cdot T_{CLK}/17$ with respect to the phase $\phi_{15}$.

This operation continues also for the following switch-on and switch off periods.

In various embodiments, the PWM generator circuit is thus configured to generate a PWM signal, wherein:
the switch-on duration corresponds to $T_{ON} = k \cdot T_{CLK} + l \cdot T_{CLK}/12$; and
the switch-off duration corresponds to $T_{OFF} = p \cdot T_{CLK} + q \cdot T_{CLK}/n$.

In various embodiments, the parameter n (number of delay stages/phase) is fixed at a hardware level. However, the number n could also be programmable, e.g., by using in FIG. 2 a given fixed number of delay stages (e.g., 32) and selecting the n-th phase (and not necessarily the last one) as feedback signal provided to the phase detector PD. In fact, in this way, the control loop will still be locked to the n-th phase $\phi_n$, with $T_{DU} = T_{CLK}/n$.

Thus, in various embodiments, the timer circuit of the PWM signal generator circuit (comprising the counter circuit and the comparator circuit) is configured to:
during a switch-on period $T_{ON}$, increase a count value from a reset value until the count value reaches the integer value k; and
during a switch-off period $T_{OFF}$, increase a count value from a reset value until the count value reaches the integer value p.

However, in general, the timer circuit may also monitor the switching duration $T_{SW}$, i.e., the timer circuit of the PWM signal generator circuit (comprising the counter circuit and the comparator circuit) may be configured to:
during a switch-on period, increase a count value from a reset value until the count value reaches the integer value k; and
during a switch-off period, increase the count value used during the switch-on period until the count value reaches the integer value i.

Thus, in various embodiments, the PWM signal generator circuit is configured to determine the parameters k/l, and at least one of p/q, and i/j wherein:
in case of a switch-on period $T_{ON}$, k corresponds to the integer number of clock cycles of the clock signal CLK and l corresponds to the integer number of the fractions 1/n of a clock cycle of the clock signal CLK;
in case of a switch-off period $T_{OFF}$, p corresponds to the integer number of clock cycles of the clock signal CLK and q corresponds to the integer number of the fractions 1/n of a clock cycle of the clock signal CLK; and
in case of a switching period $T_{SW}$, i corresponds to the integer number of clock cycles of the clock signal CLK and j corresponds to the integer number of the fractions 1/n of a clock cycle of the clock signal CLK.

Specifically, in view of the above definitions:

$$T_{ON} = k \cdot T_{CLK} + l \cdot T_{CLK}/n \quad (2)$$

$$T_{OFF} = p \cdot T_{CLK} + q \cdot T_{CLK}/n \quad (3)$$

$$T_{SW} = T_{ON} + T_{OFF} = i \cdot T_{CLK} + j \cdot T_{CLK}/n \quad (4)$$

the integer values i and j are related to the integer values k, l, p and q according to the following equations:
in case (l+q)<n (without overflow):

$$i = k+p; j = l+q; \quad (5)$$

in case (l+q)≥n (with overflow):

$$i = k+p+1; j = l+q-n. \quad (6)$$

Thus, in various embodiments, the PWM generator circuit is configured to receive at least two of the parameters i, k and p, and at least two of the parameters j, l and q. For example, the PWM signal generator circuit may directly receive the parameters k/l and/or p/q and/or i/j, such as:
data identifying (e.g., corresponding to) the parameters k/l; and
data identifying (e.g., corresponding to) the parameters p/q.

Figure 6A:
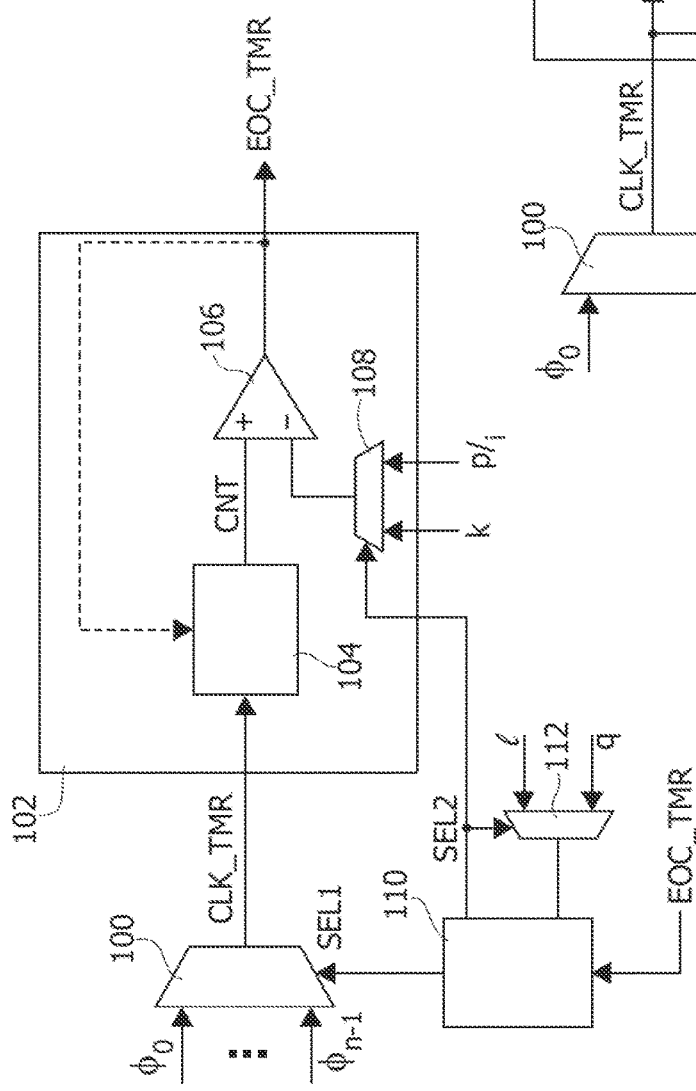
FIGS. 6A and 6B show embodiments of a timer circuit in accordance with the present disclosure.

Alternatively, the PWM signal generator circuit may receive other data permitting a calculation of these parameters according to equations (5) and (6), such as:
data identifying the switching duration $T_{SW}$, such as the above-mentioned parameters i and j, and one of:
data identifying (e.g., corresponding to) the parameters k/l;
data identifying (e.g., corresponding to) the parameters p/q; or
data identifying the duty cycle As shown in FIG. 6A, in various embodiments, the PWM signal generator circuit comprises a timer circuit 102 comprising a digital counter circuit 104 configured to vary (i.e., increase or decrease) an integer count value CNT in response to a clock signal CLK_TMR and a comparator circuit 106 configured to compare the count value CNT with a respective integer comparison threshold.

As shown in FIG. 6A, the same counter 104 and comparator 106 may be used for both the switch-on period and the switch-off period by selecting, e.g., via a multiplexer 108, the parameter k or p as comparison threshold. Accordingly, by resetting the counter 104 via the signal at the output of the comparator 106, the same counter 104 may be used to monitor the switch-on period and the switch-off period. However, the counter 104 may also be used to monitor the switch-on period and the duration $T_{SW}$. For example, in this case, the multiplexer 108 may receive the parameters k and i, and the counter 104 may only be reset when the count value CNT reaches the value i.

Figure 6B:
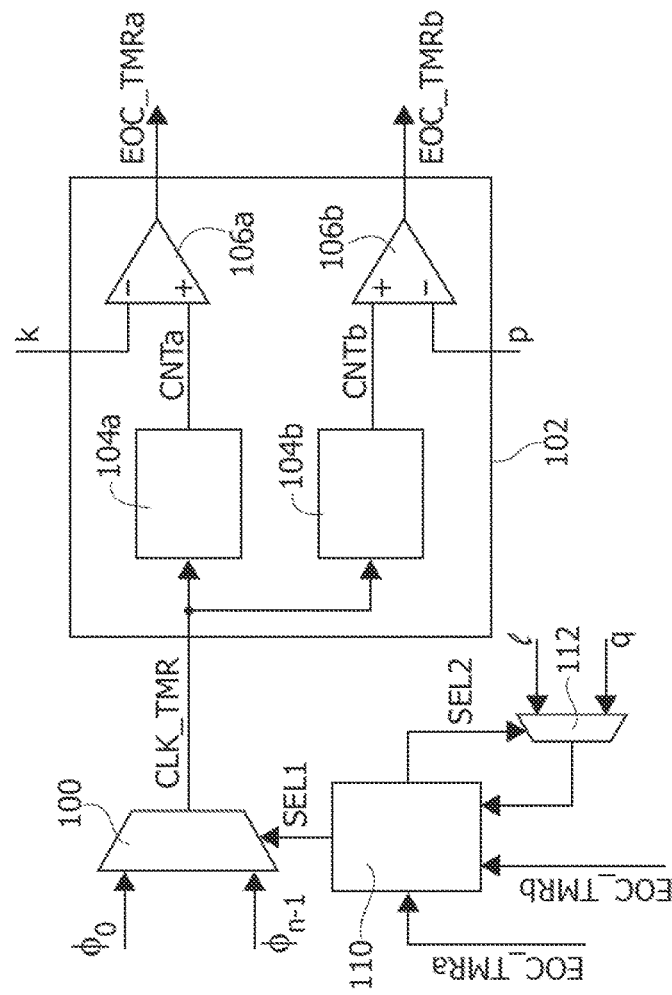

Alternatively, as shown in FIG. 6B, a respective counter 104a and 104b and comparator 106a and 106b may be used for the switch-on period and the switch-off period, wherein the comparator 106a compares a count value CNTa provided by the counter 104a with the parameter k and the comparator 106b compares a count value CNTb provided by the counter 104ab with the parameter p.

In various embodiments, the timer circuit 102 is configured to generate one or more trigger signal when the output of the comparator indicates that the count value has reached the comparison threshold, e.g., by using a signal EOC_TMR at the output of the comparator 106, or respective signal EOC_TMRa and EOC_TMRb at the outputs of the comparators 106a and 106b.

In the embodiments considered, the signal EOC_TMR (FIG. 6A) or the signals EOC_TMRa and EOC_TMRb (FIG. 6B) are provided to a control circuit 110 with selects the clock signal CLK_TMR for timer circuit 102, in particular the counter 104 (104a/104b), as a function of:
during a switch-on period, the parameter 1; and
during a switch-off period, the parameter q.

Specifically, even when monitoring the end of the switching duration $T_{SW}$, it is preferably to obtain, e.g., calculate according to equations (5) and (6), the parameter q, because this parameter indicates the additional fractions which have to be added with respect to the previous switch-on period.

For example, the control circuit 110 may select the clock signal CLK_TMR by driving via a selection signal SEL1 a multiplexer 100 receiving at input the clock phases $\phi_0 \ldots \phi_{n-1}$. Similarly, the control signal may drive via a selection signal SEL2 a multiplexer 112 in order to select either the parameter 1 or the parameter q, i.e., the selection signal indicates whether the current period is a switch-on period or a switch-off period, and may thus also be used to drive the multiplexer 108.

Specifically, in various embodiments, in response to a trigger in the signal EOC_TMR (FIG. 6A) or the signals EOC_TMRa and EOC_TMRb (FIG. 6B), the control circuit 110 is configured to change the logic value of the selection signal SEL1:
during a switch-on period, as a function of the parameter l; and
during a switch-off period, as a function of the parameter q.

Specifically, in various embodiments, the control circuit also performs a modulo operation in order to maintain the selection signal SEL1 between 0 and n−1. Accordingly, in response to a trigger in the signal EOC_TMR (FIG. 6A) or the signals EOC_TMRa and EOC_TMRb (FIG. 6B), the control circuit 110 varies the selection signal SEL1:
during a switch-on period, SEL1=(SEL1+l) mod n; and
during a switch-off period, SEL1=(SEL1+q) mod n.

Thus, essentially, the control circuit 110 implements a phase accumulator circuit, which adds to the currently selected phase either 1 or q, wherein the parameters q may be calculated, e.g., as shown in equations (5) and (6) as a function of the parameters j and n.

Finally, in various embodiments, the respective period (either a switch-on or switch-off period) is terminated and the following period is started with the next clock pulse (i.e., with the next rising or falling edge based on which type of edge is used by the timer circuit 102) of the selected clock phase.

Thus essentially, during a switch-on period $T_{ON}$ the trigger signal EOC_TMR (or EOC_TMRa) is generated after a time $k \cdot T_{CLK}$, and by changing the clock signal CLK_TMR the switch-on period is terminated, thereby starting the following switch-off period, after an additional time $l/n \cdot T_{CLK}$. Similarly, during a switch-off period $T_{OFF}$ the trigger signal EOC_TMR (or EOC_TMRb) is generated after a time $p \cdot T_{CLK}$ (which may be obtained, e.g., by resetting the counter 104 and waiting for p cycles or by waiting until the count value reaches i), and by changing the clock signal CLK_TMR the switch-off period is terminated, thereby starting the following switch-on period, after an additional time $q/n \cdot T_{CLK}$.

Figure 7:
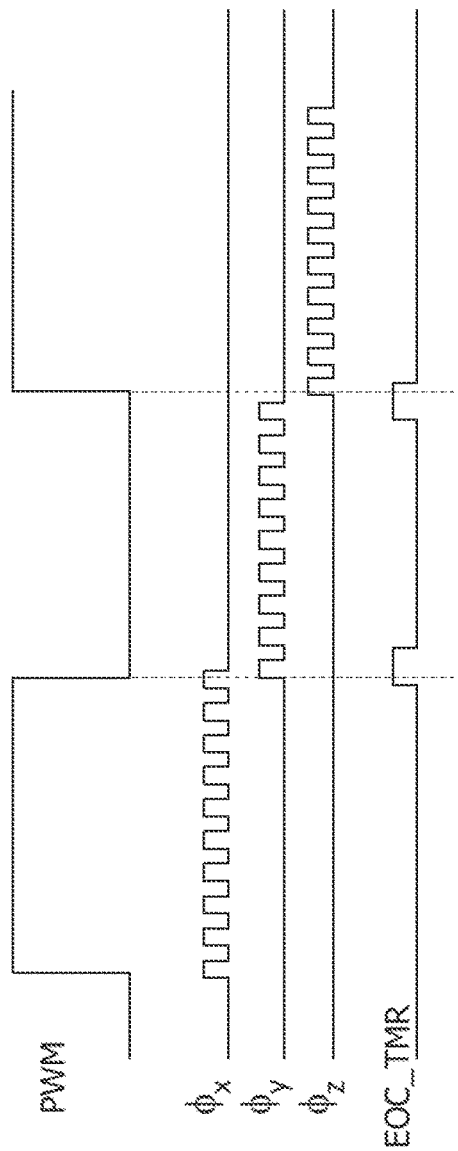
FIG. 7 shows exemplary waveforms generated by the timer circuits of FIGS. 6A and 6B.

For example, this is shown in FIG. 7, wherein during a switch-on period, the timer circuit uses a clock phase CLK_TMR=$\phi_x$, and the trigger signal EOC_TMR is set after, e.g., k=9 periods of the phase $\phi_x$, e.g., with the $10^{th}$ rising edge. In response to the trigger signal EOC_TMR (EOC_TMRa) the control circuit selects a new phase CLK_TMR=$\phi_y$ (with y=(x+l) mod n). Moreover, in response to the immediately following (e.g., rising) edge in the signal $\phi_y$, the PWM signal generator circuit terminates the switch-on period and starts the following switch-off period, thereby introducing an additional time corresponding a fraction l/n of the clock period.

In the embodiment considered, during the following switch-off period, the timer circuit uses then the clock phase CLK_TMR=$\phi_y$, and the trigger signal EOC_TMR is set after, e.g., p=8 periods of the phase $\phi_y$, e.g., with the $9^{th}$ rising edge. In response to the trigger signal EOC_TMR (EOC_TMRb) the control circuit selects a new phase CLK_TMR=$\phi_z$ (with z=(y+q) mod n). In response to the immediately following (e.g., rising) edge in the signal $\phi_z$, the PWM signal generator circuit terminates the switch-off period and starts the following switch-on period, thereby introducing an additional time corresponding a fraction q/n of the clock period.

In the previous embodiments, the control circuit 110 is configured to drive the selection circuit 100 in order to changes the phase $\phi$ assigned to the clock signal CLK_TMR from the current phase $\phi(t)$ (e.g., $\phi_0$) to the next phase $\phi(t+1)$ (e.g., $\phi_5$) in response to the signal EOC_TMR, thereby adding the fractions (1 or q) at the end of the respective switch-on or switch-off period.

However, in various embodiments, the switching from the current phase (kW to the next phase $\phi(t+1)$ may occur at any instant during the respective period. In this case, the control unit 110 may also be configured to either increase/decrease sequentially, e.g., in response to the clock signal CLK_TMR, the selection signal SEL1 from the old phase $\phi(t)$ to the new phase $\phi(t+1)$ (e.g., $\phi_0, \phi_1, \phi_2, \phi_3, \phi_4, \phi_5$) or by switching directly to the new phase.

Generally, while reference has been made to periods of the clock signal CLK, indeed the phases $\phi_0 \ldots \phi_{n-1}$ may also have a different clock period $T_{PLL}$, e.g., the frequency $f_{PLL}=1/T_{PLL}$ may be a multiple of the clock frequency $f_{CLK}$, e.g., by using a frequency divider in the feedback loop of the phase $\phi_{n-1}$. Accordingly, in general:
the switch-on duration corresponds to $T_{ON}=k \cdot T_{PLL}+l \cdot T_{PLL}/n$; and
the switch-off duration corresponds to $T_{OFF}=p \cdot T_{PLL}+q \cdot T_{PLL}/n$.

Figure 8:
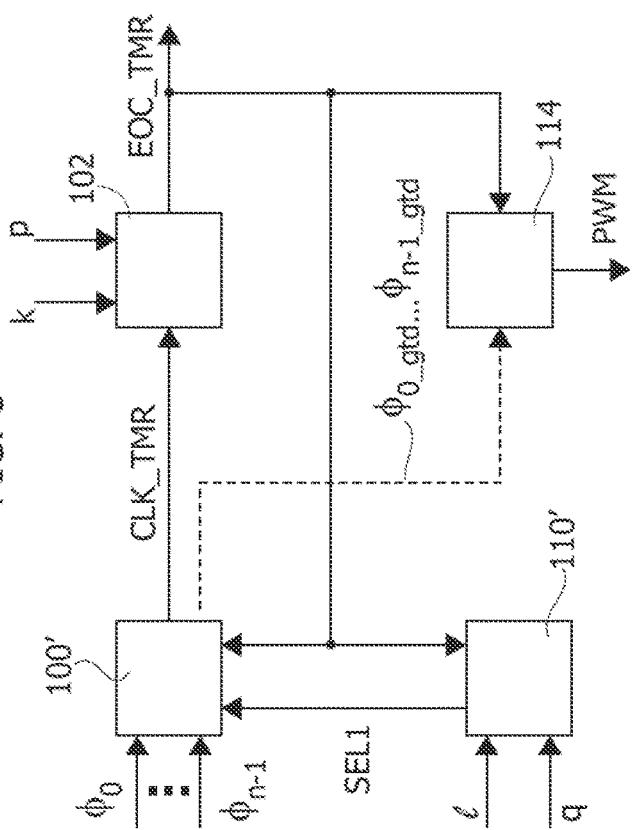
FIG. 8 shows an embodiment of a PWM generator circuit.

FIG. 8 shows a second embodiment of a PWM signal generator circuit.

Specifically, in the embodiment considered, the PWM signal generator circuit comprises again a timer circuit 102, a clock switching circuit 100' and a control circuit/phase accumulator 110'.

Specifically, with respect to FIGS. 6A and 6B, the clock switching circuit 100' is not implemented with a mere multiplexer, but with a circuit which directly generates, in response to the trigger signal EOC_TMR provided by the timer circuit 102, the clock signal CLK_TMR for the timer circuit as a function of the selection signal SEL1 provided by the control circuit 110'. Generally, as described in the foregoing, also any other trigger signal may be used to assign to the clock signal CLK_TMR a new clock phase as a function of the selection signal SEL1.

Figure 9A:
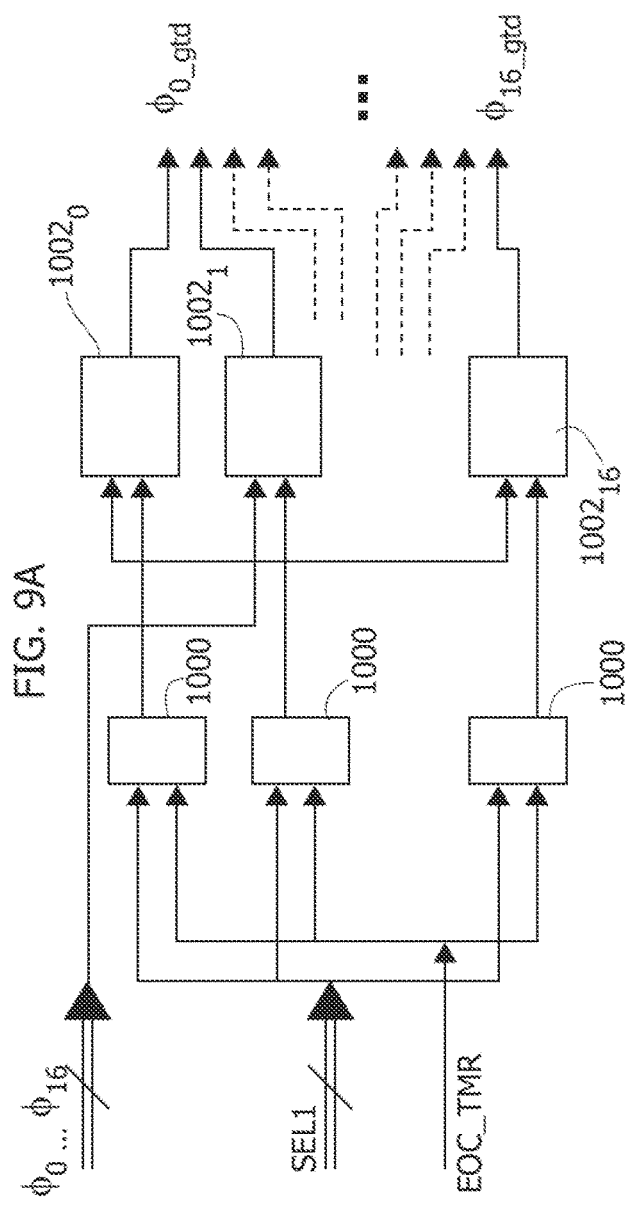
Figure 9B:
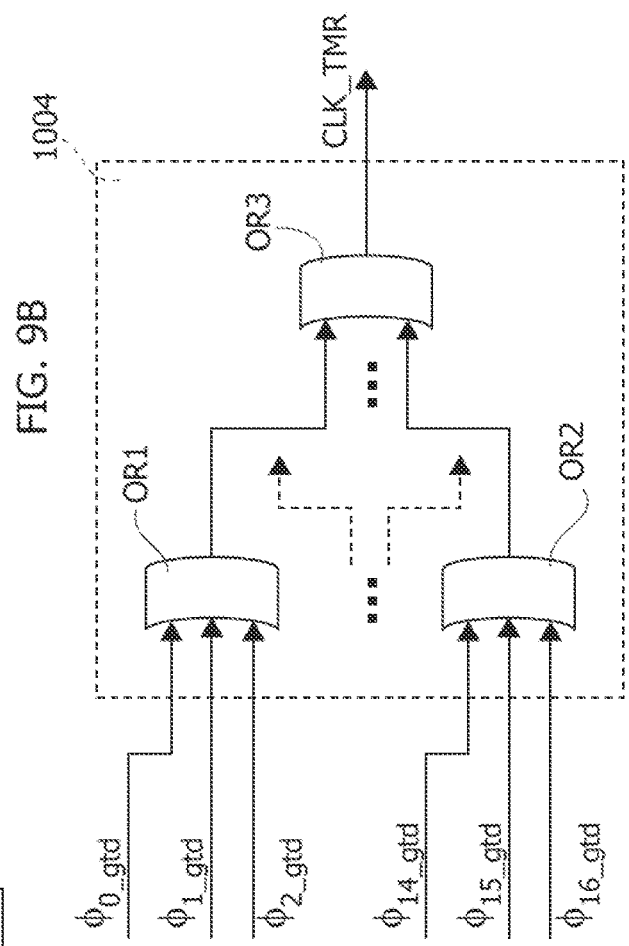

For example, a possible embodiment of the clock switching circuit 100' is shown in FIGS. 9A and 9B.

In the embodiment considered, the selection signal SEL1 (indicative of the next clock phase), is provided to a series of optional latches 1000 configured to store the value of the signal SEL1 in response to the trigger signal EOC_TMR. Substantially, these latches 1000 ensure that the circuit samples the value of the signal SEL1 only when a trigger in the signal EOC_TMR is generated.

In the embodiment considered, each clock phase $\phi_0 \ldots \phi_{n-1}$ is provided to a respective transmission gate (gated clock cells) $1002_0 \ldots 1002_n$ being enabled as a function of the selections signal SEL1 or optionally the latched selections signal SEL1, thereby generating respective (gated) signals $\phi_{0\_gtd} \ldots \phi_{n-1\_gtd}$. For example, in various embodiments, the selection signal comprises (n) bits $SEL_0 \ldots SEL_{n-1}$ and uses a one-hot encoding, wherein a given bit is associated univocally with a given clock phase $\phi_0 \ldots \phi_{n-1}$, i.e., only one of the bits $SEL_0 \ldots SEL_{n-1}$ is set and indicates that the respective clock phase $\phi_0 \ldots \phi_{n-1}$ may pass through the respective transmission gate $1002_0 \ldots 1002_{n-1}$, while the other clock phases $\phi_0 \ldots \phi_{n-1}$ cannot pass through the respective transmission gates $1002_0 \ldots 1002_{n-1}$. In general, also other encoding schemes may be used for the selection signal (such as a binary encoding), and the transmission gates may be driven via a decoder circuit configured to generate the one-hot encoded drive signals for the transmission gates $1002_0 \ldots 1002_{n-1}$ as a function of the selection signal SELL As shown in FIG. 9B, the signals $\phi_{0\_gtd} \ldots \phi_{n-1\_gtd}$ are then provided to a combinational logic circuit 1004 configured to generate at output the clock signal CLK_TMR for the timer circuit 102 by combining the signals $\phi_{0\_gtd} \ldots \phi_{n-1\_gtd}$. For example, in various embodiments the signals $\phi_{0\_gtd} \ldots \phi_{n-1\_gtd}$ are combined via a logic OR operation, e.g., implemented with a cascaded structure of a plurality of OR gates OR1, OR2, OR3, etc.

FIG. 10A shows the operation of the clock switching circuit 100' at the example of a selection signal SEL1 having in sequence the value k, x and y, thereby activating (in response to the trigger signal EOC_TMR) in sequence the clock phases $\phi_{k\_gtd}$, $\phi_{x\_gtd}$ and $\phi_{y\_gtd}$.

Thus, in case the selection signal SEL1 changes, the clock signal CLK_TMR switches from a first clock phase to a second clock phase in response to the selection signal.

Specifically, as shown in FIG. 10B, when the second clock phase ($\phi_{x\_gtd}$) goes to high (rising edge), while the first clock phase ($\phi_{k\_gtd}$) is still high, the resulting clock signal CLK_TMR will have a single clock pulse with a duration being greater than the clock period $T_{PLL}$ of the clock phases $\phi_0 \ldots \phi_{n-1}$, thereby essentially losing a clock cycle.

Usually this occurs when the respective fraction l or q is smaller than n/2.

Conversely, as shown in FIG. 10C, when the second clock phase ($\phi_{y\_gtd}$) goes to high (rising edge), while the first clock phase (d)<sub>x</sub>d) is low, the resulting clock signal CLK_TMR will have a single clock pulse, with a duration being smaller than the clock period $T_{PLL}$ of the clock phases $\phi_0 \ldots \phi_{n-1}$. Usually this occurs when the respective fraction l or q is greater than n/2.

Thus, the lost clock edge (FIG. 10B) should be taken into account in order to correctly determine the duration of the respective time interval. Specifically, in various embodiments, in case a clock cycle is lost, i.e., the respective fraction l or q is smaller than n/2, the PWM signal generator circuit is configured to increase the timer circuit 102 by an additional clock cycle, i.e., the timer 102 is increase by 2 and not only 1 for a single clock cycle.

Figure 11A:
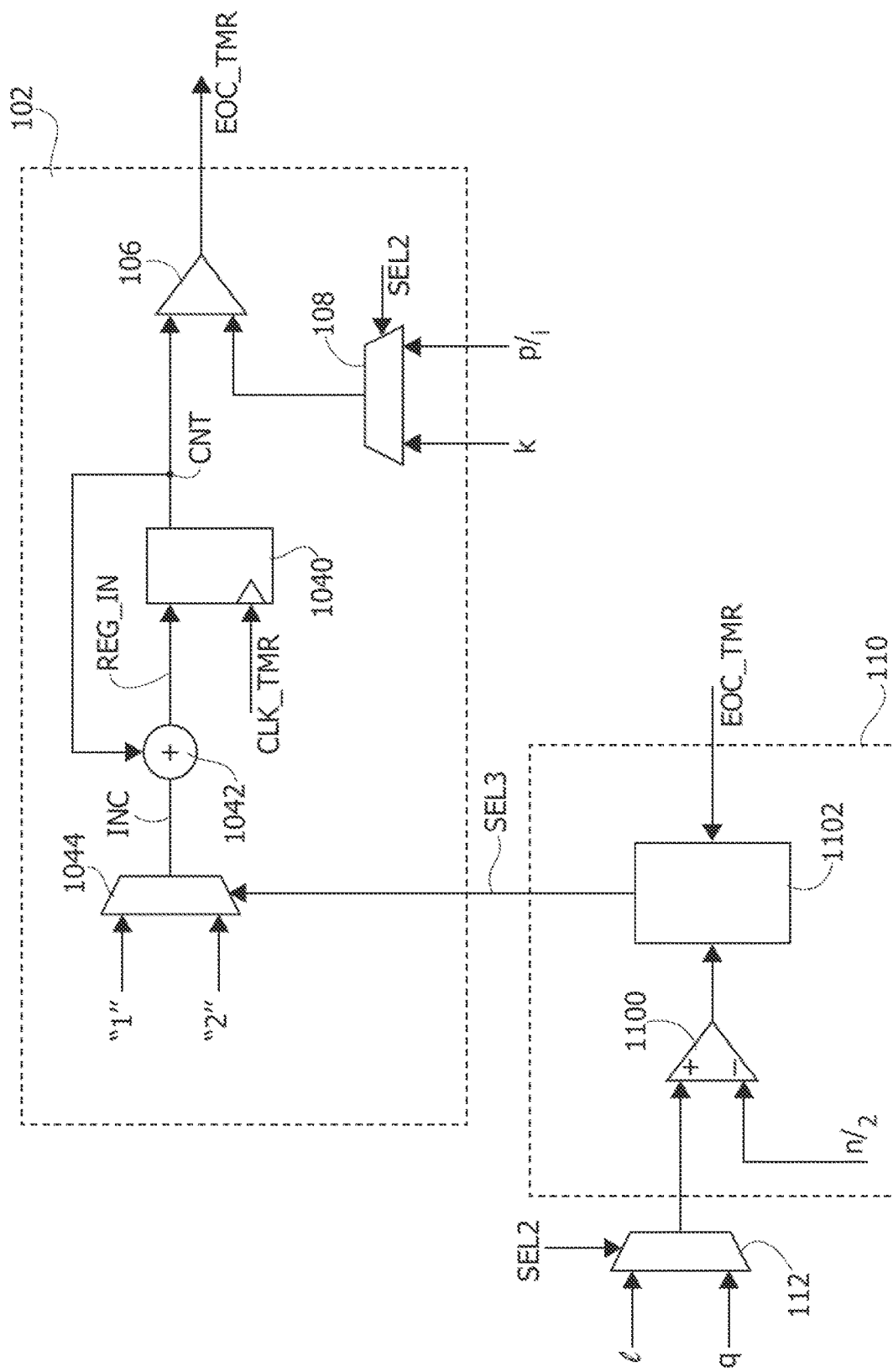

FIG. 11A shows a possible embodiment of the timer circuit 102.

Specifically, in the embodiment considered, the counter 104 is implemented with an accumulator comprising:
a register 1040 providing at an output the count value CNT, wherein the register 1040 is configured to store a signal REG_IN at a respective input in response to the clock signal CLK_TMR; and
a digital adder 1042, configured to generate the signal REG_IN at the input of the register 1040 by adding an increment value INC to the count value CNT.

In the embodiment considered, the increment value INC may be set either to "1" or "2", e.g., via a multiplexer 1044. Specifically, the selection is driven via a selection signal SEL3 provided by the control circuit 110 (or similarly by the control circuit 110').

Specifically, in the embodiment considered, the control circuit 110 comprises:
a digital comparator 1100 configured to determine whether the fraction value l or q of the current switch-on or switch-off period is greater than n/2; and
a circuit 1102 configured to generate a selection signal SEL3 as a function of the comparison signal generated by the comparator 1100 and a trigger signal indicating the start of a new switch-on or switch-off period, such as the signal EOC_TMR or, in the general case, as a function of the comparison signal generated by the comparator 1100 and a generic trigger signal whose length is one CLK_TMR cycle and generated in any appropriate instant during the switch-on or switch-off period.

Specifically, in the embodiment considered, the multiplexer 112 already provide the fraction value for the current period, wherein the selection signal SEL2 indicates whether the current period is a switch-on or switch-off period. Accordingly, the comparator 1100 may receive at input the signal provided by the multiplexer 112 and thus generates a comparison signal indicating whether the fraction value l or q is greater than n/2. Specifically, the circuits 110 and 112 are configured:
when the signal at the output of the comparator indicates that the fraction l or q (based on the current period) is greater than n/2 or the trigger signal (e.g., EOC_TMR) is not set, drive the multiplexer 1044 via the signal SEL3 in order to selected the value "1", whereby the accumulator 1040/1042 is increased in response to the clock signal CLK_TMR by "1"; and
when the signal at the output of the comparator indicates that the fraction l or q (based on the current period) is smaller than n/2 and the trigger signal (e.g., EOC_TMR) is set, drive the multiplexer 1044 via the signal SEL3 in order to selected the value "2", whereby the accumulator 1040/1042 is increased in response to the clock signal CLK_TMR by "2".

Accordingly, substantially, the timer circuit 104 is configured to increase for one clock cycle of the signal CLK_TMR (i.e., a single cycle for each switch-on or switch-off period) the count value by two ("2") when the fraction l or q (based on the current period) is smaller than n/2.

Figure 11B:
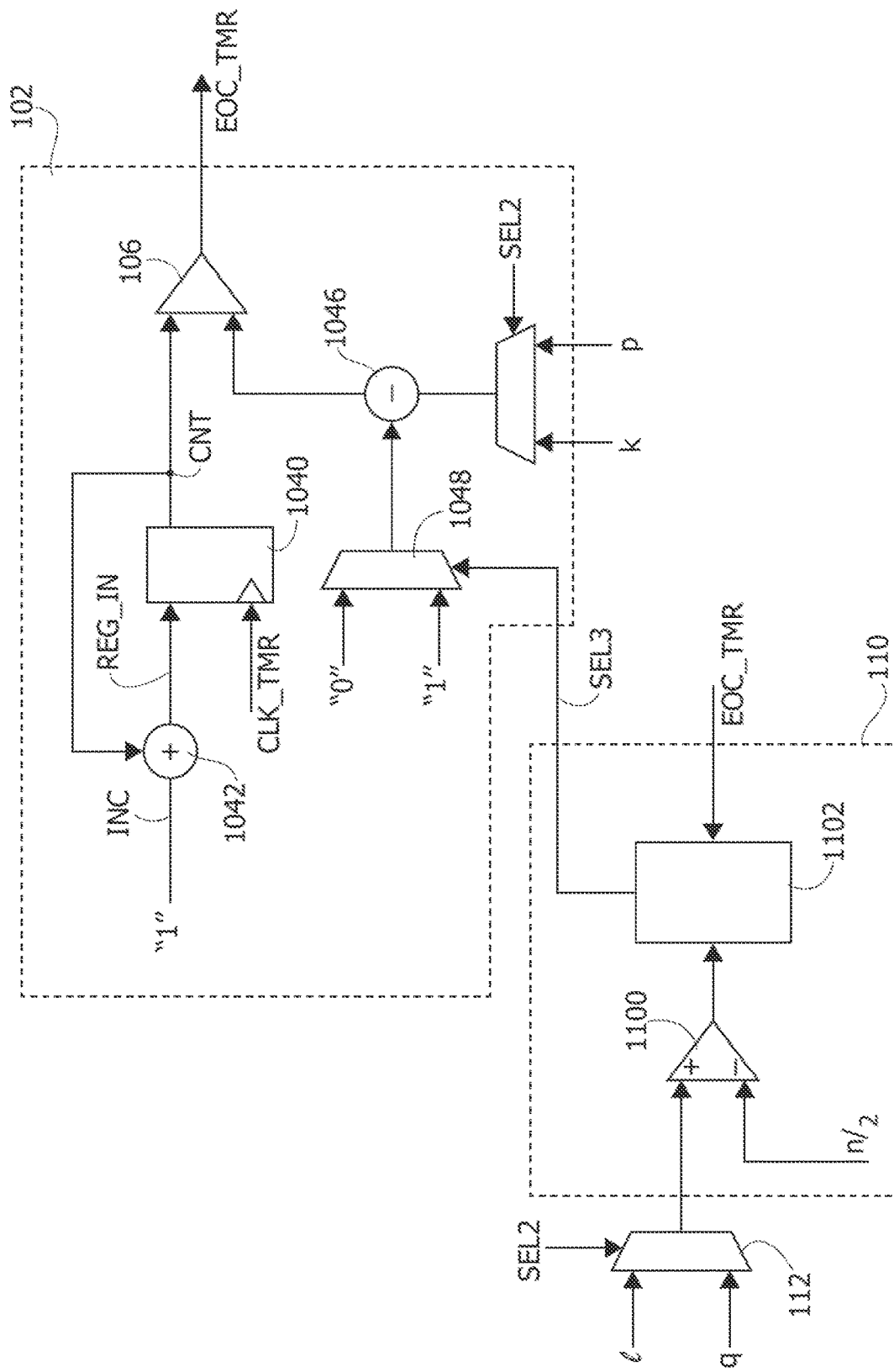

Conversely, FIG. 11B shows that a similar result may be obtained by adapting directly the threshold value used by the comparator 106.

Specifically, in the embodiment considered, the increment value INC is always set to "1", and an additional digital subtractor is provided which is configured, e.g., via a multiplexer 1048, to:
subtract the value "1" from the current threshold selected by the multiplexer 108 (k or p); or
maintain the threshold value, e.g., by subtracting the value "0" from the current threshold selected by the multiplexer 108 (k or p).

In general, the embodiments may also be combined, i.e., during a switch-on duration may be implemented either the "plus-two" mechanism (FIG. 11A) or the adaption of the threshold k (FIG. 11B), and during a switch-off duration may be implemented either the "plus-two" mechanism or the adaption of the threshold p.

Accordingly, in the embodiments considered, the circuits 1100/1102 inform the timer circuit 102 that a counting edge has been missed or will be missed due to clock combination shown in FIG. 9B. This missing edge information (i.e., the signal SEL3) can be computed by the control circuit/phase accumulator machine 110/110' that controls the fine delay selection and generates the phase selection change SEL1 (indicative of the next clock phase to be used for fine tuning of PWM signal). In fact, if the new phase selection selects a clock having its rising edge appearing during the on-time of the running clock, the combined CLK_TMR will have a longer on-time and the edge of the next selected clock phase, used in the clock combination circuitry of FIG. 9B, will be missed. This happens if the phase selection change is smaller than the half of number of available phases i.e., this occurs when the respective fraction l or q is smaller than n/2 (e.g., $\lfloor 17/2 \rfloor = 8$).

Using this clock change property, the timer may be incremented by "1" or "2", or the threshold of the comparator 106 may be adapted with respect to this internal flag generated as shown in FIG. 11A or 11B.

In various embodiments, the PWM signal is switched in response to the next rising edge of the new clock phase, i.e., the selected clock phase $\phi_{0\_gtd} \ldots \phi_{n-1\_gtd}$ of the following switch-on or switch-off period. However, the PWM signal may also be changed in response to the rising edge of the trigger signal EOC_TMR in the case of a SELL signal generated in any appropriate instant during the given time slot/period.

For example, as shown in FIG. 8, the PWM signal generator circuit may comprise a toggle circuit 114 configured to generate the PWM signal as a function of the signals $\phi_{0\_gtd} \ldots \phi_{n-1\_gtd}$ and the trigger signal EOC_TMR.

Generally, any suitable circuit may be used to toggle the level of the PWM signal in response to the signal EOC_TMR (or EOC_TMRa and EOC_TMRb) and the new clock phase.

For example, FIG. 12A shows an embodiment of the toggle circuit 114. Specifically, the toggle circuit 114 comprise a rising edged detector circuit. Specifically, in the embodiment considered, the toggle circuit comprises for each of the signals $\phi_{0\_gtd} \ldots \phi_{n-1\_gtd}$ a respective rising edge detector $1140_0 \ldots 1140_{n-1}$, which is enabled as a function of the signal EOC_TMR.

Specifically, as shown in FIGS. 12B, 12C and 12D, in response to the rising edge of the current clock phase (e.g., $\phi_{k\_gtd}$ in FIG. 12C), the signal EOC_TMR will be set after a brief delay. In response to the trigger in the signal EOC_TMR, the circuit 100' will switch to the new clock phase (e.g., $\phi_{x\_gtd}$ in FIG. 12C). Thus, no additional rising edge of the old clock signal (e.g., $\phi_{k\_gtd}$ in FIG. 12C) occurs. Thus, in response to the following rising edge in the new clock phase (e.g., $\phi_{x\_gtd}$ in FIG. 12C) the respective edge detector 1140 will set its output (e.g., to high), because also the signal EOC_TMR is still set.

Accordingly, in the embodiment considered, the output of the various rising edge detector $1140_0 \ldots 1140_{n-1}$ may be connected to a combinational logic circuit, e.g., implementing a logic OR function (FIG. 12A shows schematically a logic OR gate OR4, that may correspond to the last OR gate of a chain of OR gates, e.g., comprising in cascade 6 OR gates having three inputs, 2 OR gates having 2 inputs and the OR gate OR4) for this purpose but, generally speaking, it can be implemented with a different number and topology of gates as a result of a different balancing process with respect to speed and to the number of clock phases), which generates at output a trigger signal TRIG indicating that the logic level of the PWM signal has to change.

Accordingly, in the embodiment considered, the signal TRIG may be used to drive a flip-flop FF1 in order to invert the output of the flip-flop FF1, wherein the PWM signal is generated as a function (and preferably corresponds to) the signal at the output of the flip-flop FF1.

For example, in the embodiment considered, the flip-flop FF1 is implemented with a D-type flip-flop, receiving at the data terminal D via an inverter INV1 the inverted output signal of the flip-flop FF1, thereby inverting the output of the flip-flop FF1 in response to the trigger signal TRIG.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A Pulse-Width Modulated (PWM) signal generator circuit, comprising:
    a multiphase clock generator configured to generate phase-shifted clock phases having a same clock period and being phase shifted by a time corresponding to a fraction of the clock period, the PWM signal generator circuit configured to:
        generate a PWM signal having a given switching duration including a switch-on duration and a switch-off duration,
        determine for each switch-on duration a number of clock periods of the switch-on duration and a number of the fractions of the clock period of the switch-on duration, and
    determine for each switch-off duration a number of clock periods of the switch-off duration, and a number of the fractions of the clock period of the switch-off duration.

2. The PWM signal generator circuit of claim 1, further comprising:
    a clock switching circuit configured to generate a timer clock signal by selecting one of the phase shifted clock phases as the timer clock signal based on a selection signal.

3. The PWM signal generator circuit according to claim 2, further comprising:
    a timer circuit including one or more counters and one or more comparators, the timer circuit configured to:
        during the switch-on duration, vary a first count value in response to the timer clock signal and generate a first trigger when the first count value reaches a first integer number, the first integer number indicative of the number of clock periods of the switch-on duration, and
        during the switch-off duration, vary a second count value in response to the timer clock signal and generate a second trigger when the second count value reaches a second integer number, the second integer number indicative of the number of clock periods of the switch-off duration;

a phase accumulator circuit configured to generate the selection signal by:
   during the switch-on duration, increasing the selection signal by a third integer number, the third integer number indicative of the number of fractions of the clock period of the switch-on duration, and
   during the switch-off duration, increasing the selection signal by a fourth integer number, the fourth integer number indicative of the number of fractions of the clock period of the switch-off duration; and a toggle circuit configured to:
   in response to said first trigger, set the PWM signal to low, and
   in response to said second trigger, set the PWM signal to high.

4. The PWM signal generator circuit according to claim 3, configured to receive at an input the first, second, third, and fourth integer numbers.

5. The PWM signal generator circuit according to claim 3, configured to:
   during the switch-on duration, determine whether the third integer number is smaller than n/2, where n is equal to a number of the phase-shifted clock phases, and in response to determining the third integer number is smaller than n/2, increase the first count value for a single clock cycle of said timer clock signal by two; and
   during the switch-off duration, determine whether the fourth integer number is smaller than n/2, and in response to determining the fourth integer number is smaller than n/2, increase the second count value for a single clock cycle of said timer clock signal by two.

6. The PWM signal generator circuit according to claim 3, configured to:
   during the switch-on duration, determine whether the third integer number is smaller than n/2, where n is equal to a number of the phase-shifted clock phases, and in response to determining the third integer number is smaller than n/2, decrease the first integer number by one; and
   during the switch-off duration, determine whether the fourth integer number is smaller than n/2, and in response to determining the fourth integer number is smaller than n/2, decrease the second integer number by one.

7. The PWM signal generator circuit according to claim 3, wherein the timer circuit includes a single counter configured to generate the first count value and the second count value, and wherein the single counter is reset at the beginning of each switch-on duration and each switch-off duration.

8. The PWM signal generator circuit according to claim 3, wherein the timer circuit includes a single counter configured to generate the first count value and the second count value, and wherein the single counter is reset only at the beginning of each switch-on duration.

9. The PWM signal generator circuit according to claim 3, wherein the phase accumulator circuit is configured to generate the selection signal by:
   in response to the first trigger, increasing the selection signal by the second integer number, and
   in response to the second trigger, increasing the selection signal by the fourth integer number.

10. The PWM signal generator circuit according to claim 3, wherein the clock switching circuit includes:
   for each of the phase shifted clock phases a respective transmission gate, each transmission gate configured to generate a respective gated clock phase based on the selection signal; and
   a combinational logic circuit configured to generate the timer clock signal by combining the gated clock phases.

11. An integrated circuit, comprising:
   a PWM signal generator circuit configured to:
      receive a number of phase-shifted clock phases having a same clock period and being phase shifted by a time corresponding to a fraction of the clock period;
      generate a PWM signal having a given switching duration including a switch-on duration and a switch-off duration;
      determine for each switch-on duration a number of clock periods of the switch-on duration and a number of the fractions of the clock period of the switch-on duration; and
      determine for each switch-off duration a number of clock periods of the switch-off duration, and a number of the fractions of the clock period of the switch-off duration.

12. The integrated circuit according to claim 11, wherein the PWM signal generator circuit includes:
   a clock switching circuit configured to select one of the phase shifted clock phases as a timer clock signal based on a selection signal.

13. The integrated circuit according to claim 12, wherein the PWM signal generator circuit includes:
   a timer circuit including one or more counters and one or more comparators, the timer circuit configured to:
      during the switch-on duration, vary a first count value in response to the timer clock signal and generate a first trigger when the first count value reaches a first integer number, the first integer number indicative of the number of clock periods of the switch-on duration, and
      during the switch-off duration, vary a second count value in response to the timer clock signal and generate a second trigger when the second count value reaches a second integer number, the second integer number indicative of the number of clock periods of the switch-off duration;

a phase accumulator circuit configured to generate the selection signal by:
   during the switch-on duration, increasing the selection signal by a third integer number, the third integer number indicative of the number of fractions of the clock period of the switch-on duration, and
   during the switch-off duration, increasing the selection signal by a fourth integer number, the fourth integer number indicative of the number of fractions of the clock period of the switch-off duration; and a toggle circuit configured to:
   in response to the first trigger, set the PWM signal to low, and
   in response to the second trigger, set the PWM signal to high.

14. The integrated circuit according to claim 12, wherein the PWM signal generator circuit is configured to:
   during the switch-on duration, determine whether the third integer number is smaller than n/2, and in response to determining the third integer number is smaller than n/2, increase the first count value for a single clock cycle of the timer clock signal by two; and during the switch-off duration, determine whether the fourth integer number is smaller than n/2, and in response to determining the fourth integer number is smaller than n/2, increase the second count value for a single clock cycle of the timer clock signal by two.

15. The integrated circuit according to claim 12, wherein the PWM signal generator circuit is configured to:

during the switch-on duration, determine whether the third integer number is smaller than n/2, and in response to determining the third integer number is smaller than n/2, decrease the first integer number by one; and during the switch-off duration, determine whether the fourth integer number is smaller than n/2, and in response to determining the fourth integer number is smaller than n/2, decrease the second integer number by one.

16. The integrated circuit according to claim 12, wherein the timer circuit includes a single counter configured to generate the first count value and the second count value, and wherein the single counter is reset at the beginning of each switch-on duration and each switch-off duration.

17. A method, comprising:

receiving a number of phase-shifted clock phases having a same clock period and being phase shifted by a time corresponding to a fraction of said clock period;

generating a PWM signal having a given switching duration including a switch-on duration and a switch-off duration;

determining for each switch-on duration a number of clock periods of the switch-on duration and a number of the fractions of the clock period of the switch-on duration; and determining for each switch-off duration a number of clock periods of the switch-off duration, and a number of the fractions of the clock period of the switch-off duration.

18. The method of claim 17, further comprising:
selecting one of the phase shifted clock phases as a timer clock signal based on a selection signal.

19. The method of claim 18, further comprising:

during the switch-on duration, varying a first count value in response to the timer clock signal and generating a first trigger when the first count value reaches a first integer number, the first integer number indicative of the number of clock periods of the switch-on duration; and during the switch-off duration, vary a second count value in response to the timer clock signal and generate a second trigger when the second count value reaches a second integer number, the second integer number indicative of the number of clock periods of the switch-off duration.

20. The method of claim 19, further comprising:

during the switch-on duration, increasing the selection signal by a third integer number, the third integer number indicative of the number of fractions of the clock period of the switch-on duration;

during the switch-off duration, increasing the selection signal by a fourth integer number, the fourth integer number indicative of the number of fractions of the clock period of the switch-off duration;

setting the PWM signal to low, in response to the first trigger; and setting the PWM signal to high, in response to the second trigger.

* * * * *